(12) United States Patent
Cornelius

(10) Patent No.: US 7,518,881 B2
(45) Date of Patent: *Apr. 14, 2009

(54) INTERPOSER CONTAINING BYPASS CAPACITORS FOR REDUCING VOLTAGE NOISE IN AN IC DEVICE

(75) Inventor: William P. Cornelius, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/781,116

(22) Filed: Jul. 20, 2007

(65) Prior Publication Data

US 2007/0291448 A1  Dec. 20, 2007

Related U.S. Application Data

(62) Division of application No. 10/871,845, filed on Jun. 17, 2004, now Pat. No. 7,268,419.

(51) Int. Cl.
*H05K 7/02* (2006.01)
*H05K 7/06* (2006.01)
*H05K 7/08* (2006.01)
*H05K 7/10* (2006.01)

(52) U.S. Cl. .............. 361/760; 361/763; 361/795; 361/803; 257/685; 257/686

(58) Field of Classification Search ......... 361/760–765, 361/795, 803; 257/685–686
See application file for complete search history.

(56) References Cited

U.S. PATENT DOCUMENTS

| 6,072,690 | A  | * | 6/2000  | Farooq et al. ........... 361/321.2 |
| 6,346,743 | B1 | * | 2/2002  | Figueroa et al. ............ 257/723 |
| 6,900,991 | B2 | * | 5/2005  | Patel et al. ................... 361/782 |
| 6,961,230 | B2 |   | 11/2005 | Otsuka et al. |
| 6,970,362 | B1 |   | 11/2005 | Chakravorty |
| 2003/0102555 | A1 | | 6/2003 | Patel et al. |

* cited by examiner

*Primary Examiner*—Tuan T Dinh
(74) *Attorney, Agent, or Firm*—Park. Vaughan & Fleming LLP

(57) ABSTRACT

One embodiment of the present invention provides an apparatus that reduces voltage noise for an integrated circuit (IC) device. This apparatus includes an interposer, which is configured to be sandwiched between the IC device and a circuit board. This interposer has a bottom surface, which is configured to receive electrical connections for power, ground and other signals from the circuit board, and a top surface, which is configured to provide electrical connections for power, ground and the other signals to the IC device. A plurality of bypass capacitors are integrated into the interposer and are coupled between the power and ground connections for the IC device, so that the plurality of bypass capacitors reduce voltage noise between the power and ground connections for the IC device.

6 Claims, 4 Drawing Sheets

INTERPOSER CONTAINING BYPASS CAPACITORS FOR REDUCING VOLTAGE NOISE IN AN IC DEVICE

RELATED APPLICATION

This application is a divisional under 37 C.F.R § 1.53(b) of, and claims priority under 35 U.S.C. §121 to, a co-pending non-provisional application by the same inventor as the instant application entitled, "INTERPOSER CONTAINING BYPASS CAPACITORS FOR REDUCING VOLTAGE NOISE IN AN IC DEVICE," having Ser. No. 10/871,845, and filing date 17 Jun. 2004 now U.S. Pat. No. 7,268,419.

BACKGROUND

1. Field of the Invention

The present invention relates to techniques for reducing voltage noise in electrical circuits. More specifically, the present invention relates to an interposer containing bypass capacitors that operate to reduce voltage noise on an integrated (IC) circuit device, such as a microprocessor chip.

2. Related Art

As microprocessors become progressively faster, voltage noise in the microprocessor core is becoming a significant factor in limiting system performance. Higher operating frequencies are causing circuitry within the microprocessor core to switch at faster rates. This faster switching can result in significant "step currents," which are caused for example by changing code patterns, sleep cycles, etc. Step currents can cause a significant voltage drop on the microprocessor die which is proportionate to L(di/dt), where L is the loop inductance from core power to core ground as seen from the microprocessor die, where di is the step current, and where dt is the time frame over which the step current occurs. If this voltage drop (or any other form of voltage noise) causes the voltage at the microprocessor core to drop below a minimum voltage, $V_{min}$, an error in the circuitry can potentially arise. Hence, the voltage drop at the microprocessor core caused by step currents can limit the maximum operating frequency, $F_{max}$, of the microprocessor.

Furthermore, as microprocessors have become faster, operating voltages within the microprocessor core have decreased. This lower operating voltage makes it possible for circuitry within the microprocessor core to switch more rapidly. However, it also makes the circuitry more sensitive to small amounts of voltage noise.

Voltage noise can be somewhat mitigated by using bypass capacitors to decouple to power and ground pins on the microprocessor die. For example, FIG. 1 illustrates how a microprocessor die 102 is integrated into a conventional microprocessor system. As is illustrated in FIG. 1, microprocessor die 102 is electrically coupled to a package 104 through a number of microbumps (or solder balls) on the backside of die 102. Package 104 is also electrically coupled to circuit board 106 through larger solder balls on the backside of package 104.

Note that electrical signals from die 102 flow through vias in package 104 to conductors within circuit board 106. In particular, power and ground lines from die 102 flow through package 104 into circuit board 106. In additional to connecting to power and ground planes within circuit board 106, these power and ground lines also flow through vias in circuit board 106 and attach to bypass capacitors 108 on the backside if circuit board 106.

Note that the larger current loops, which flow from die 102 through package 104 and through circuit board 106 to bypass capacitors 108, cause a significant loop inductance, L, that can cause increased noise at higher operating frequencies (i.e. signals with low dt).

This problem can be addressed by making a larger package and covering the area underneath the die on the bottom of the package with capacitors. (These capacitors are typically of the IDC type, with multiple alternating electrodes to reduce the capacitor loop inductance.) The disadvantage of this technique is that it requires a much larger package area, which is expensive, and is also prohibitive in certain product designs that require a small footprint.

Hence, what is needed is a method and an apparatus for lowering loop inductance for bypass capacitors without the above-described problems.

SUMMARY

One embodiment of the present invention provides an apparatus that reduces voltage noise for an integrated circuit (IC) device. This apparatus includes an interposer, which is configured to be sandwiched between the IC device and a circuit board. This interposer has a bottom surface, which is configured to receive electrical connections for power, ground and other signals from the circuit board, and a top surface, which is configured to provide electrical connections for power, ground and the other signals to the IC device. A plurality of bypass capacitors are integrated into the interposer and are coupled between the power and ground connections for the IC device, so that the plurality of bypass capacitors reduce voltage noise between the power and ground connections for the IC device.

The present invention reduces the voltage noise on the IC device by lowering the loop inductance the IC device sees from its ground to power pins. This is accomplished by moving the bypass capacitors closer to the IC device, which decreases the path length and also decreases the loop area and thereby decreases the loop inductance. In particular, the present invention moves the bypass capacitors from being on the side of the circuit board opposite the IC device (as is illustrated in FIG. 1) to being located within an interposer located between the IC device and the circuit board. This reduces the inductance of the bypassing loop by eliminating the distance through the circuit board, which is a substantial portion of the bypassing inductance.

Additionally, the present invention has the capability to greatly reduce the loop inductance (compared to a capacitor array on the opposite side of the microprocessor circuit board assembly) because it can provide more current paths (a denser array of capacitors for example) than are possible on the opposite side of the circuit board assembly. Furthermore, the volume in the interposer can accommodate more capacitance than can fit in the space on the opposite side of the circuit board.

In a variation on the above embodiment, the plurality of bypass capacitors are electrically connected to power and ground conductors on the top surface of the interposer, so that step currents caused by the IC device (which is coupled to the top surface of the interposer) enter and leave the plurality of bypass capacitors through the top surface of the interposer. Additionally, the internal planes of the plurality of bypass capacitors extend downward from the top surface of the interposer in a direction that is normal to the top surface of the interposer.

In a further variation, distal ends of the internal planes of the plurality of bypass capacitors, which are located farthest from the top the interposer, are electrically connected to power and ground conductors on the bottom surface of the interposer. In this way, the internal planes of the plurality of bypass capacitors function as power and ground leads that electrically couple the power and ground planes of the circuit board with power and ground connections on the IC device.

In a variation on this embodiment, the bottom surface of the interposer has the same electrical connections in the same locations as the IC device, whereby the interposer can be attached to a circuit board which is configured to be connected directly the IC device without having to reconfigure the circuit board to accommodate the interposer.

In a variation on this embodiment, the interposer is configured to be sandwiched between a package for the IC device and the circuit board, so that the IC device is bonded to the top surface of the package, and the bottom surface of the package is bonded to the top surface of the interposer.

In a variation on this embodiment, the interposer is configured to be sandwiched between the IC device and a package for the IC device, so that the IC device is bonded to the top surface of the interposer, and the bottom surface of the interposer is bonded to the top surface of the package.

In a variation on this embodiment, interposer contains vias for routing power ground and other signals from the top surface of the interposer to the bottom surface of the interposer.

In a variation on this embodiment, the IC device is a microprocessor chip.

One embodiment of the present invention provides an apparatus that reduces voltage noise for an IC device. This apparatus includes a bypass capacitor with a top surface which is configured to face a bottom surface of the IC device. This bypass capacitor is configured to be electrically coupled to power and ground conductors on the bottom surface of the IC device, so that step currents caused by the IC device enter and leave the bypass capacitor through the top surface of the bypass capacitor. Furthermore, the internal planes of the bypass capacitor extend downward from the top surface of the bypass capacitor in a direction that is normal to the top surface of the bypass capacitor.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Microprocessor System

Figure 1:
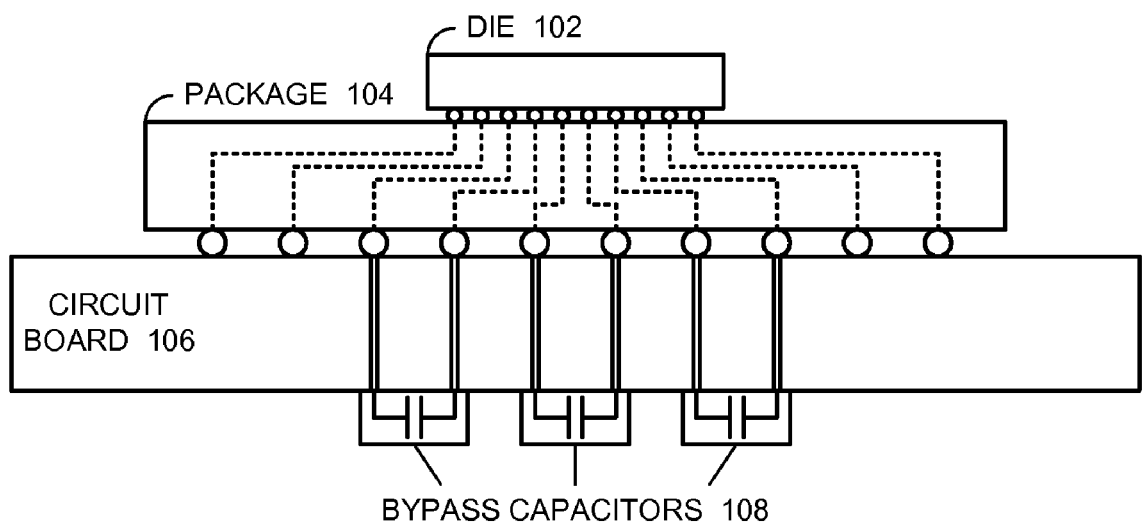
FIG. 1 illustrates how a microprocessor die and bypass capacitors are integrated into a conventional microprocessor system.
Figure 2A:
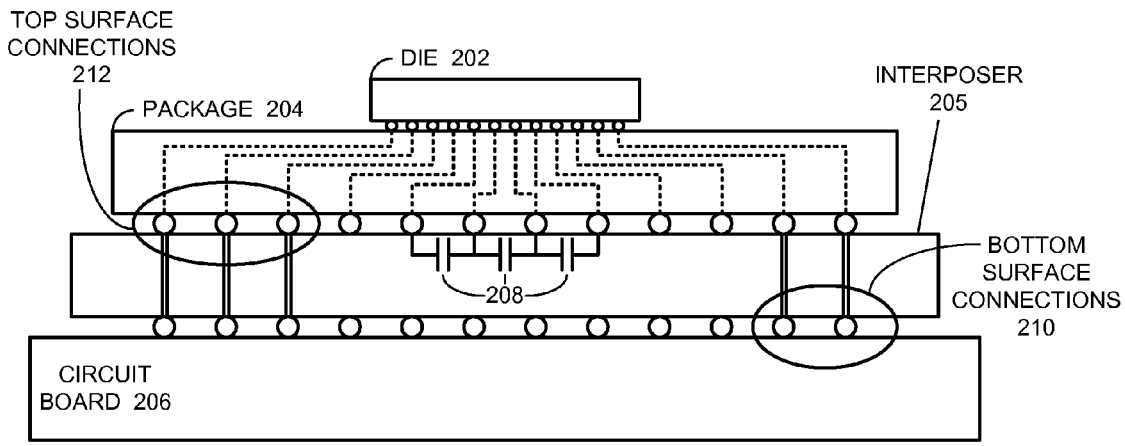
FIG. 2A illustrates how a microprocessor die and bypass capacitors are integrated into a microprocessor system in accordance with an embodiment of the present invention.

FIG. 2A illustrates how a microprocessor die 202 and bypass capacitors 208 are integrated into a microprocessor system in accordance with an embodiment of the present invention. Like the system illustrated in FIG. 1, this system includes a microprocessor die 202, which is attached to a package 204 and a circuit board 206. However, unlike the system illustrated in FIG. 1, the system illustrated in FIG. 2A includes an interposer 205, which is located between package 204 and circuit board 206. Interposer 205 includes a number of vias that electrically couple power, ground and other signal lines from package 204 to circuit board 206. In addition to these vias, interposer 205 also contains a number of bypass capacitors 208 for decoupling power and ground lines that are attached to pins on microprocessor die 202.

Hence, the bypass capacitors located within interposer 205 can provide a much larger bulk capacitance than can be provided by the bypass capacitors 108 illustrated in FIG. 1, which are located on the backside of circuit board 206. Furthermore, the bypass capacitors within interposer 205 are closer to microprocessor die 202 than the bypass capacitors 108 illustrated in FIG. 1, which are located on the backside of circuit board 106.

Furthermore, the bottom surface of interposer 205 can be configured to have the same electrical connections in the same locations as package 204. This allows interposer 205 to be attached to a circuit board 206, which is configured to be connected directly to package 204, without having to reconfigure circuit board 206 to accommodate interposer 205.

Figure 2B:
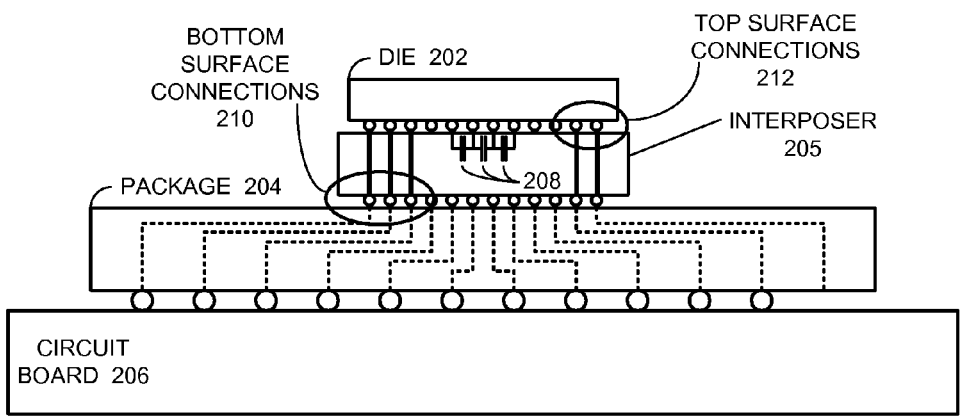
FIG. 2B illustrates how a microprocessor die and bypass capacitors are integrated into a microprocessor system in accordance with an alternative embodiment of the present invention.

As shown in FIG. 2B, interposer 205 can alternatively be sandwiched between the microprocessor die 202 and a package 204. In this configuration, microprocessor die 202 is bonded to the top surface of interposer 205, and the bottom surface of the interposer 205 is bonded to the top surface of package 204. This configuration further reduces the size of current loops by eliminating the need for current loops to traverse package 204.

In yet another embodiment of the present invention, bypass capacitors 208 are embedded within package 204, instead of being embedded within a separate interposer 205. Note that in this embodiment, interposer 205 is not needed.

Note that although package 204 and circuit board 206 also contain internal planes for power and ground, these internal planes are not central to the present invention and are hence not illustrated in FIGS. 2A and 2B.

Current Loops through a Conventional Bypass Capacitor

Conventional bypass capacitors can create a large amount of loop inductance at higher frequencies. For example, FIG. 3 illustrates a current loop 302, which flows through a conventional bypass capacitor 108.

Figure 3:
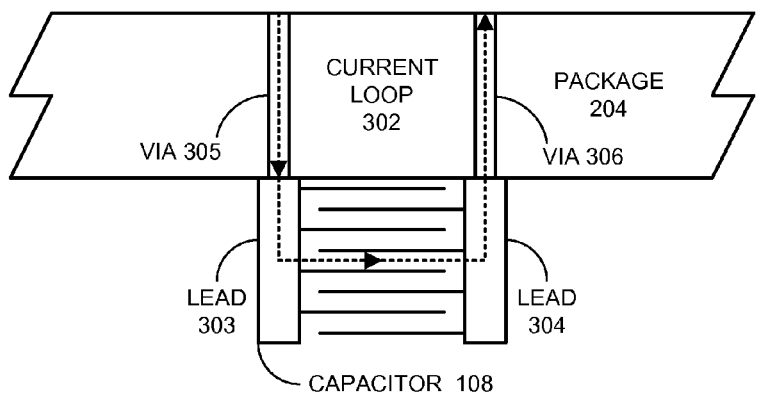
FIG. 3 illustrates how current flows through a conventional bypass capacitor.

In FIG. 3, a step current that originates from a microprocessor die flows through via 305 in package 104 and into lead 303 of bypass capacitor 108. Lead 303 is attached to internal planes within capacitor 208. A return current from other internal planes within bypass capacitor 108, which are attached to the other lead 304 of capacitor 208, flows through via 306 in package 204 back to the microprocessor die.

Note that this current loop flows through the entire length of bypass capacitor 108. Furthermore, if bypass capacitor 108 is increased in size by adding new more internal planes, these additional internal planes will be farther from the microprocessor die, which increases the size of the current loops through these additional planes.

Current Loops through a New Type of Bypass Capacitor

Figure 4:
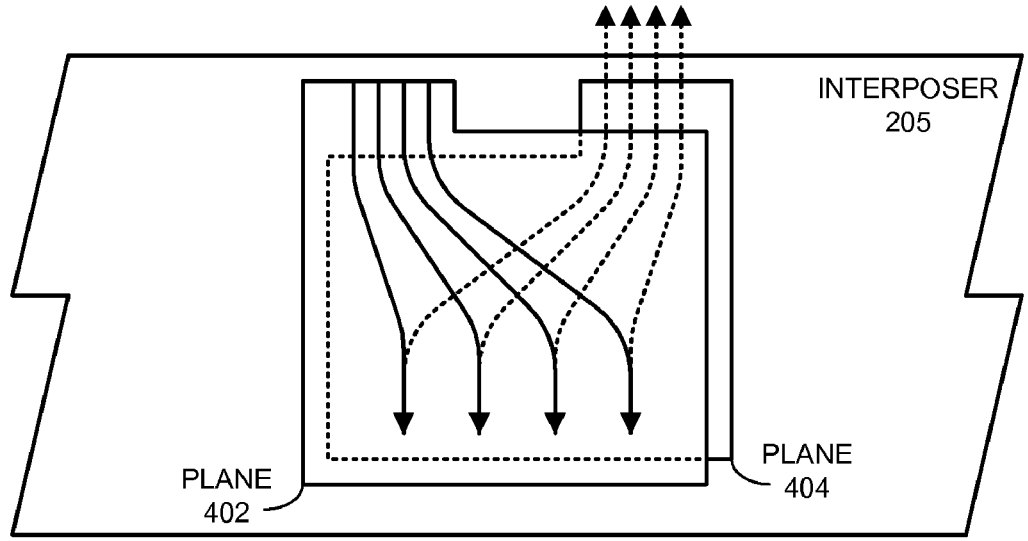
FIG. 4 illustrates how current flows through a new type of bypass capacitor in accordance with an embodiment of the present invention.

FIG. 4 illustrates how current flows through a new type of bypass capacitor in accordance with an embodiment of the present invention. This new type of bypass capacitor is electrically connected to power and ground conductors on the top surface of interposer 205, so that step currents caused by the IC device (which is coupled to the top surface of the interposer) enter and leave the plurality of bypass capacitors through the top surface of interposer 205. Additionally, the internal planes (402 and 404) of bypass capacitor extend downward from the top surface of interposer 205 in a direction that is normal to the top surface of interposer 205. (Although only two planes 402 and 404 are illustrated in FIG. 4, there are actually many more underlying planes which are not illustrated.)

The current flow through this new type of bypass capacitor is illustrated by arrows in FIG. 4. Forward current flow into the bypass capacitor is illustrated by solid arrows, and return current flow out of the bypass capacitor is illustrated by dashed arrows.

Inductance through these current paths is very low, because current flows in the opposite direction in adjacent plates, which causes the inductive flux to cancel. Furthermore, there are many parallel plates through which the current can flow, which further reduces inductance. Note that all of the features that lead to high capacitance (close plane spacing, many planes in parallel) are also ideal for making the inductance involved in moving from one lead of the capacitor to the other lead of the capacitor very low. Also note that current can flow downward in this type of capacitor to gain access to more capacitance without generating a significant amount of additional inductance.

More specifically, inductance, L, is given by the following formula.

$$L = (\text{length} \cdot \text{thickness}) / (\text{width} \cdot \text{N\_dielectrics})$$

where, "length"' is the path length of the plates; "thickness" is dielectric thickness or plate separation; "width" is the width of the plates; and "N_dielectrics" is the number of dielectrics in the capacitor. Note that in the present invention the path length through the plates (length) is relatively low, distance between the planes (thickness) can be very low, and the number of dielectrics (N_dielectrics) can be very large.

Bypass Capacitor Incorporated into Power and Ground Leads

Figure 5:
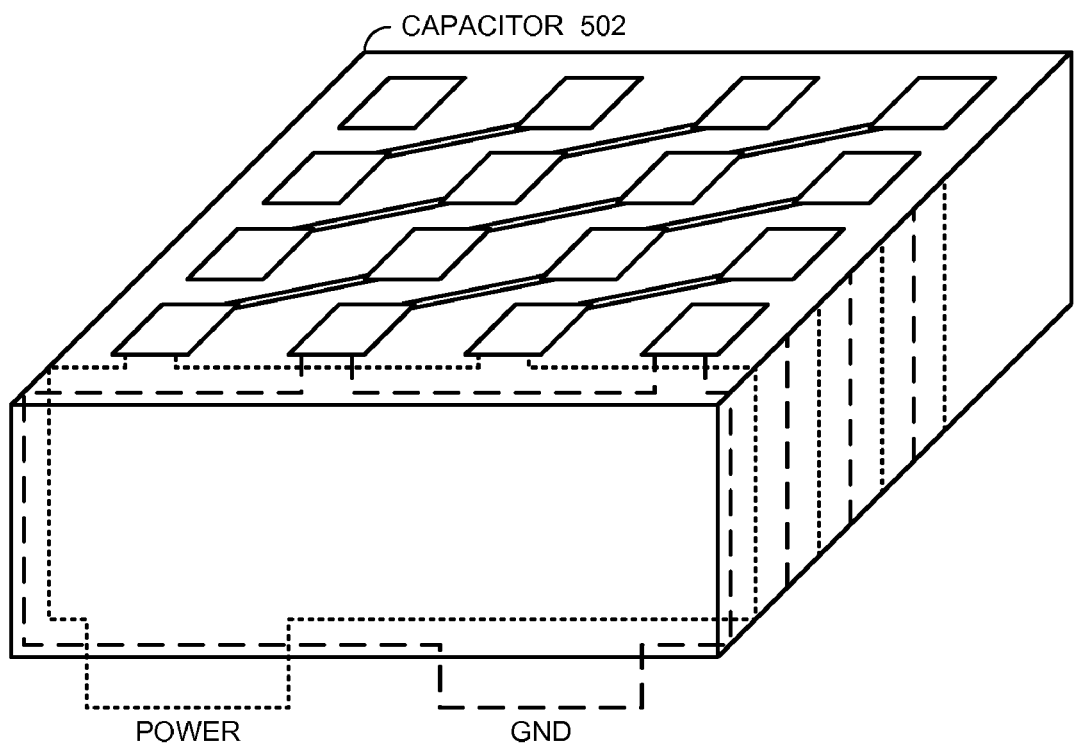
FIG. 5 illustrates how bypass capacitors can be incorporated into power and ground leads within an interposer in accordance with an embodiment of the present invention.
Figure 6A:
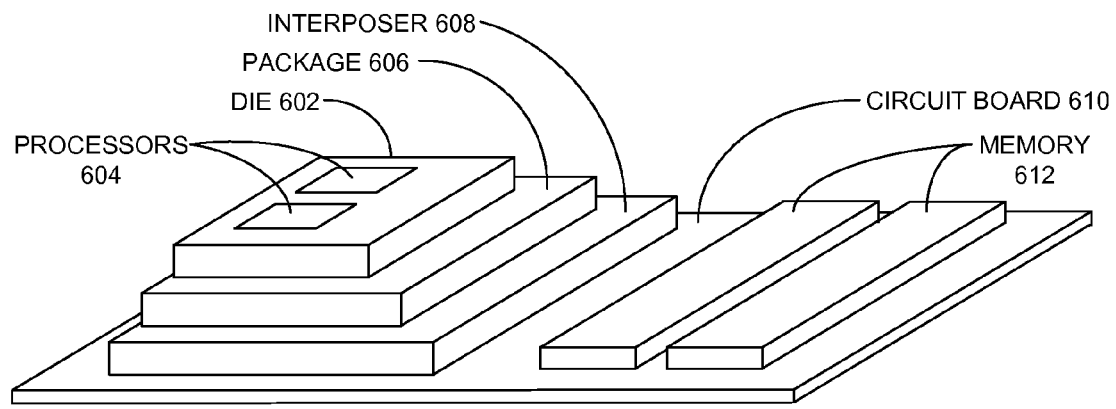
FIG. 6A illustrates a microprocessor system in accordance with an embodiment of the present invention.
Figure 6B:
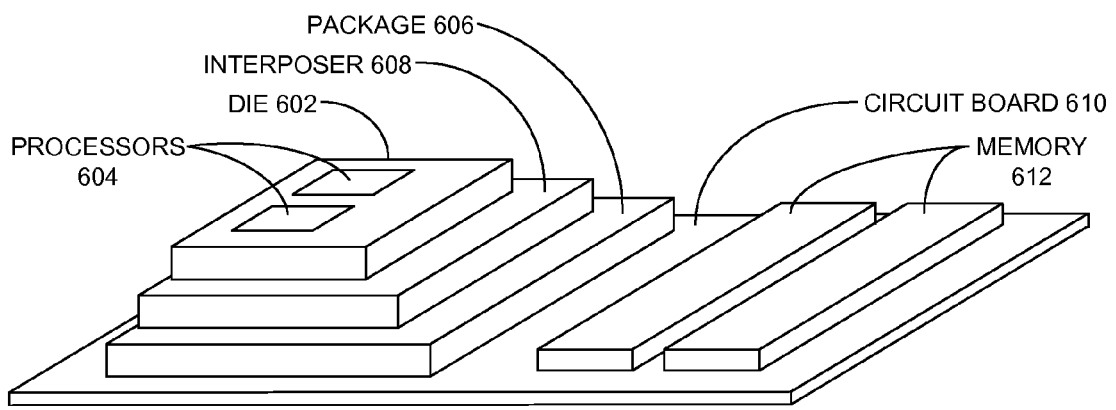
FIG. 6B illustrates a microprocessor system in accordance with an alternative embodiment of the present invention.

FIG. 5 illustrates how bypass capacitors can be incorporated into power and ground leads in accordance with an embodiment of the present invention. This embodiment, the ends of the internal planes of the bypass capacitors, which are located farthest from the top the interposer, are electrically connected to power and ground conductors on the bottom surface of the interposer. In this way, the internal planes of the bypass capacitors function as power and ground leads that electrically couple power and ground lines from the circuit board with power and ground pins on the IC device. Also note how diagonal straps on the top surface of the capacitor are used to electrically couple the power planes together and to electrically couple the ground planes together. Furthermore, there can possibly be a metal side plate (or metal strips) on the left-hand side of capacitor 502 connecting the ground planes together, and a metal side plate (or metal strips) on the right-hand side of capacitor 502 connecting power planes together.

Furthermore, note that the new type of bypass capacitor described in this specification can be configured as an array of bypass capacitors, instead of being configured as a single bypass capacitor for the entire die.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer system including a mechanism for reducing voltage noise for a processor chip, comprising:
   one or more processors located on the processor chip;
   a memory that stores instructions and data for the one or more processors;
   an interposer sandwiched between the processor chip and a circuit board;
   wherein the interposer has a bottom surface, which is configured to receive electrical connections for power, ground and other signals from the circuit board, and a top surface, which is configured to provide electrical connections for power, ground and the other signals to the processor chip; and
   a plurality of bypass capacitors, each including a set of internal planes, integrated into the interposer and coupled between the power and ground connections for the processor chip, so that the plurality of bypass capacitors reduce voltage noise between the power and ground connections for the processor chip, wherein the internal planes of the bypass capacitors extend downward from the top surface of the interposer in a direction that is normal to the top surface of the interposer;
   wherein the plurality of bypass capacitors are electrically connected to power and ground conductors on the top surface of the interposer, so that step currents caused by the processor chip which is coupled to the top surface of the interposer enter and leave the plurality of bypass capacitors through the top surface of the interposer.

2. The computer system of claim 1,
   wherein distal ends of the internal planes of the plurality of bypass capacitors, which are located farthest from the top the interposer, are electrically connected to power and ground conductors on the bottom surface of the interposer;
   whereby the internal planes of the plurality of bypass capacitors function as power and ground leads that electrically couple the power and ground connections from the circuit board with power and ground connections on the processor chip.

3. The computer system of claim 1, wherein the bottom surface of the interposer has the same electrical connections in the same locations as the processor chip, whereby the interposer can be attached to a circuit board which is configured to be connected directly the processor chip without having to reconfigure the circuit board to accommodate the interposer.

4. The computer system of claim 1,
   wherein the interposer is sandwiched between the circuit board and a package for the processor chip;
   wherein the processor chip is bonded to the top surface of the package; and wherein the bottom surface of the package is bonded to the top surface of the interposer.

5. The computer system of claim 1, wherein the interposer is sandwiched between the processor chip and a package for the processor chip;

wherein the processor chip is bonded to the top surface of the interposer; and wherein the bottom surface of the interposer is bonded to the top surface of the package.

6. The computer system of claim 1, wherein the interposer contains vias for routing power, ground, and other signals from the top surface of the interposer to the bottom surface of the interposer.

* * * * *